(12) United States Patent  (10) Patent No.: US 7,592,872 B2
El Rai  (45) Date of Patent: Sep. 22, 2009

(54) DIFFERENTIAL AMPLIFIER WITH SINGLE ENDED OUTPUT

(75) Inventor: Samir Elias El Rai, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/870,416

(22) Filed: Oct. 10, 2007

(65) Prior Publication Data

US 2009/0096532 A1   Apr. 16, 2009

(51) Int. Cl.
 *H03F 3/04* (2006.01)
(52) U.S. Cl. ............... 330/301; 330/302; 330/311
(58) Field of Classification Search ............. 330/301, 330/302, 311
See application file for complete search history.

(56) References Cited

U.S. PATENT DOCUMENTS

| | | | |
|---|---|---|---|
| 4,106,346 A * | 8/1978 | Matzuk | ............... 73/614 |
| 5,420,537 A | 5/1995 | Weedon et al. | |
| 6,259,325 B1 * | 7/2001 | Ishizuka et al. | ............ 330/301 |
| 6,326,922 B1 | 12/2001 | Hegendoerfer | |
| 6,586,999 B2 | 7/2003 | Richley | |
| 6,684,065 B2 | 1/2004 | Bult et al. | |
| 6,879,816 B2 | 4/2005 | Bult et al. | |
| 7,076,226 B2 | 7/2006 | Bult et al. | |
| 7,099,646 B1 * | 8/2006 | Jin et al. | ............ 455/313 |
| 7,180,758 B2 * | 2/2007 | Lincoln et al. | ........... 363/56.01 |
| 7,199,664 B2 | 4/2007 | Bult et al. | |
| 7,444,124 B1 * | 10/2008 | Loeb et al. | ............. 455/127.3 |
| 2001/0035792 A1 | 11/2001 | Gharpurey | |
| 2001/0041548 A1 | 11/2001 | Bult et al. | |
| 2002/0180534 A1 | 12/2002 | Bohn | |
| 2003/0045256 A1 | 3/2003 | Pettersson et al. | |
| 2004/0189388 A1 | 9/2004 | Nguyen et al. | |
| 2004/0219898 A1 | 11/2004 | Bult et al. | |
| 2006/0006950 A1 | 1/2006 | Burns et al. | |

\* cited by examiner

*Primary Examiner*—Patricia Nguyen
(74) *Attorney, Agent, or Firm*—Schwegman, Lundberg & Woessner P.A.

(57) ABSTRACT

Various embodiments for converting a differential signal to a single ended signal are disclosed. The embodiments comprise a transistor pair for receiving a differential signal; and a tank circuit coupled to the transistor pair. The tank circuit includes a first inductor and one or more capacitors. The embodiments also include a second inductor magnetically coupled to the first inductor to form a balanced/unbalanced inductor (BIMI) arrangement. The BIMI arrangement directly converts the differential signal to a single ended signal.

26 Claims, 2 Drawing Sheets

DIFFERENTIAL AMPLIFIER WITH SINGLE ENDED OUTPUT

FIELD OF THE INVENTION

The present invention relates generally to circuitry signals and more specifically to converting differential signals to single ended signals.

BACKGROUND OF THE INVENTION

The advantages of using differential circuits in radio frequency (RF) integrated circuits (ICs) and devices having those ICs are readily recognized by designers and are highly desired in the field. In these products, since input and/or output signals are often desired to be single ended, typically a differential to single ended converter (D/SE) converter is used in designs and product offerings.

A challenge in design is to ensure a current source biasing a differential pair does not have high impedance at high frequencies. As a result, a balanced/unbalanced impedance ("BALUN"), often a high frequency transformer, is used for differential/single ended (D/SE) conversions.

Unfortunately, a BALUN, though operatively and functionally a desirable option, is moderately expensive and requires a sizeable footprint set aside such that its additional bulk and physical presence on the printed circuit board, or board side, often limits optimal design and usage needs in view of current design efforts. Additionally, at least two energy transferences are conventionally undertaken to convert the differential RF IN signal to a single ended RF OUT signal, of which each conversion results in energy losses due to inefficiencies existing and inherent in the balancing, transferences and conversions.

Further, attempts to overcome the losses by alternative BALUN locations have proven ineffective and equally or more inefficient or expensive.

SUMMARY OF THE INVENTION

Various embodiments for converting a differential signal to a single ended signal are disclosed. The embodiments comprise a transistor pair for receiving a differential signal and a tank circuit coupled to the transistor pair. The tank circuit includes a first inductor and one or more capacitors. The embodiments also include a second inductor magnetically coupled to the first inductor to form a balanced/unbalanced inductor (BIMI) arrangement. The BIMI arrangement directly converts the differential signal to a single ended signal.

Thereby embodiments of the present invention directly convert a differential signal to a single ended signal by a single energy transference in a circuit arrangement without the need for additional chip area while performing more efficiently, in part due to fewer energy conversion transferences.

BRIEF DESCRIPTION OF THE DRAWINGS

Advantages of the present invention will be apparent to those of ordinary skill in the art in view of the following detailed description in which.

DETAILED DESCRIPTION

The following description is presented to enable one of ordinary skill in the art to make and use the invention and is provided in the context of a patent application and its requirements. Various modifications to the disclosed embodiments and the generic principles and features described herein will be readily apparent to those skilled in the art. Thus, the present invention is not intended to be limited to the embodiments shown, but is to be accorded the widest scope consistent with the principles and features described herein.

The present invention in various implementations reduces the amount of losses due to energy transfers (conversions, transferences, etc.) by directly transferring converted electromagnetic energy to a single ended signal output line without utilizing a BALUN. In so doing, the expense and sizeable footprint of the BALUN can be eliminated in some cases. Further, directly converting a differential signal to a single ended signal results in reduced signal loss, and the single ended signal is provided to a power amplifier through connectivity across a chip, package and board arrangement.

Figure 1:
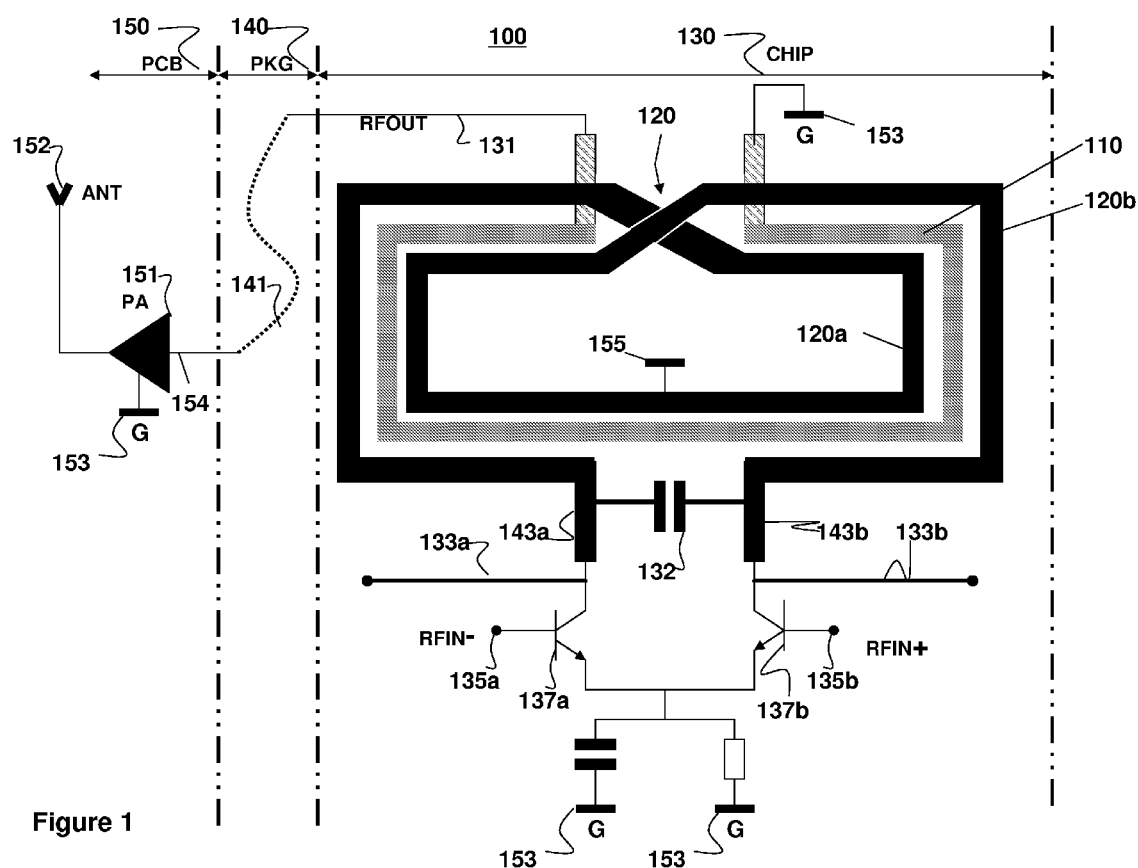
FIG. 1 depicts a single ended signal conversion circuit in accordance with an embodiment.

FIG. 1 depicts a single ended signal conversion circuit 100, in accordance with an embodiment. The conversion circuit 100 includes a differential transistor pair 137a, 137b which are coupled to ground 153. The differential pair 137a, 137b receives input signals RFIN− AND RFIN+ on their respective gates 135a, 135b. The transistor pair 137a, 137b is also coupled to differential output signals 133a, 133b respectively.

The transistor pair 137a, 137b is coupled to respective ends 143a, 143b of an inductor 120 (120a, 120b). A capacitor 132 is coupled between the ends 143a, 143b of the inductor 120. Terminal 155 is coupled to inductor 120 and provides a DC bias voltage thereto. An inductor 10 is placed in proximity to the inductor 120 between winding inductors 120a and 120b. One end of the inductor 110 is coupled to ground 153 and the other end of the inductor 110 provides a single ended output signal 131. The single ended output signal 131 is then provided to line 141 through a package 140. Line 141 in turn is coupled to amplifier 151 via line 154. The amplifier 151 which is within a printed circuit board (PCB) 150 is coupled to ground 153 and provides an output to an antenna 152.

Operation of Circuit 100

Initially, when the differential transistor pair 137a, 137b receives an input signal RFIN− and RFIN+ on their respective gates or bases 135a, 135b the signal is amplified by the transistor pair 137a, 137b over a very wide frequency band (for example between 1 MHz and 1 GHz) and provide to the differential output pins 133a, 133b. However, inductor 120 and capacitor 132 form a tank circuit that limit the frequency band of signals that will be amplified based upon the resonant frequency of the tank circuit, where the resonant frequency is defined by the equation:

$$\frac{1}{2\pi\sqrt{LC}}$$

The term "LC Tank" and "Tank Circuit" are interchangeably used and are intended to be circuits which have the ability to take the received energy and store this energy alternately in the inductor and capacitor, e.g., inductor 120 and capacitor 132, of the circuit 100. The Tank Circuit then produces an output wave, such that, for example, in circuit 100, when the capacitor 132 is discharged a maximum magnetic field around the inductors 110 or 120 results, wherein the energy originally stored in the capacitor 132 is then stored entirely in the magnetic field of the inductors 110 or 120. Accordingly, by choosing the appropriate values for the inductor 120 and the capacitor 132 a signal that is within some specified frequency range will be amplified and the signals outside of that range (i.e., noise) will not be amplified.

A DC bias voltage is applied to terminal 155 to maintain the inductor 120 at a DC voltage level (for example 3 volts) for amplification of the signal during oscillation while also allowing the terminal 155 of inductor 120 to be at an AC ground. The inductor 120 stores magnetic energy and the capacitor 132 stores electrical energy. The operation of the tank circuit provides for amplification at or near the resonant frequency of the tank circuit The inductor 120 then cooperates with the inductor 110 to provide the single ended RF OUT signal 131. The inductor 120 and inductor 110 comprise a balance/unbalanced inductor (BIMI) arrangement. The inductor 120 is referred to as a balanced inductor because it receives and outputs a differential signal. The inductor 110 is referred to as an unbalanced inductor because it receives a differential signal but outputs a single ended signal. In this embodiment, the magnetic energy from the inductor 120 is transferred to the inductor 10 via magnetic coupling. The inductor 110 then converts its magnetic energy to the single ended output signal 131. In so doing a differential input signal is converted to a single ended output signal.

The circuit 100 of FIG. 1 has several advantages over the conventional differential amplifier circuit. For example, in the circuit 100, no traditional BALUN is required or physically present for or in the chip area (i.e., IC side 140) because the BIMI arrangement provides functionality of the BALUN. Further, the unbalanced inductor 110 is arranged on or at a previously unused area of the chip, between the inductor windings 120a, 120b thereby not requiring any new chip footprint area. In addition, the BIMI and the tank circuit can be tuned to provide galvanic separation between the inductors 120 and 110, to provide optimum resonant frequency response, also provide impedance matching of the nodes 133a and 133b to the input of the amplifier 151. This tuning is accomplished utilizing industry standard circuit modeling tools which match the inductors 120 and capacitor 132 based on the desired resonance frequency for example.

By providing the desired capacitance and inductance values for capacitor 132 and inductor 120 into the circuit modeling tool the tool will provide the appropriate resonant frequency of the tank circuit based on those values. Similarly, the circuit modeling tool can provide the impedance matching characteristics at that resonant frequency based on the desired characteristics of the inductors 110 and 120 and capacitor 132. Finally, the tool can also be utilized to provide optimum galvanic separation of the inductors 110 and 120 based upon receiving the characteristics of the different types of inductors. An example tool that could be utilized the tuning is Advanced Design System (ADS) 2005 produced by Agilent Technologies.

Balnced and Unbalanced Inductors Galvanically Separated

In one implementation, the inductor 110 is arranged between the inductor 120 windings portions 120a, 120b such that the inductor 110 is galvanically separated therefrom. That is, the inductor 110 is separated from the inductor portions 120a, 120b such that there is no possibility of a dielectric short between the inductor 110 and the inductor windings 120a, 120b. The galvanic separation in one embodiment is accomplished through circuit modeling and circuit simulation techniques.

BIMI Arrangement on Unused Chip Area

In another implementation, the inductor 110 is positioned within an unused inductor space on the circuit 100 and is arranged such that the inductor 120 is minimally affected in performance, which, in one embodiment is accomplished through circuit modeling and circuit simulation techniques.

Impedance Matching Capability

In another implementation, the BIMI arrangement may also provide impedance matching between the output of the transistors 137a, 137b, which is 133a and 133b and the input of the power amplifier 151. The impedance matching of the BIMI arrangement in one embodiment is accomplished through circuit modeling and circuit simulation techniques.

Accordingly as before mentioned the differential signal 135a, 135b is received and is directly converted to a resulting single ended output signal 131 utilizing the BIMI arrangement based upon the frequency selectivity of the tank circuit. Operatively, the present invention in accordance with various implementations perform a single energy transfer thereby reducing losses associated with energy transfers, in part, by reducing the number of energy transfer events in the conversion of signals from a differential to a single ended result.

Process for Directly Converting Differential Signal

Figure 2:
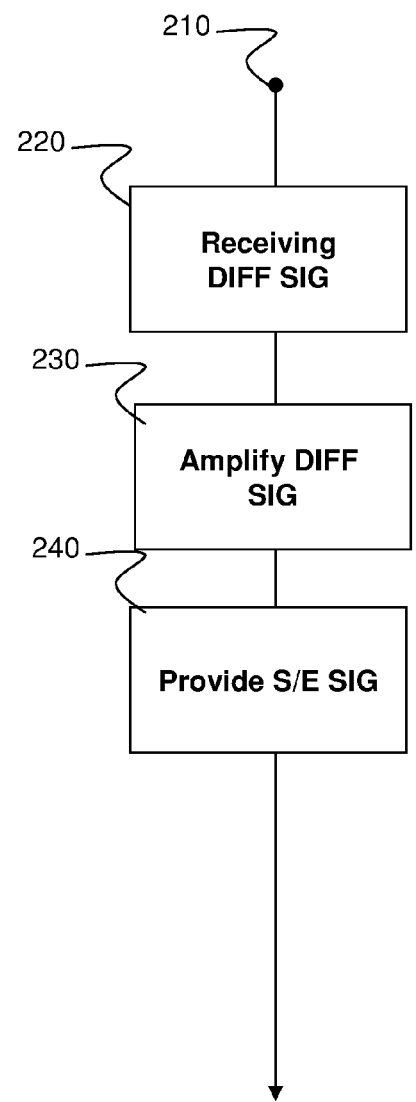
FIG. 2 sets forth a flowchart of a method embodiment.

FIG. 2 sets forth a flowchart of a method embodiment. The method begins at 210 where a differential signal e.g., RFIN− and RFIN+, is received at 220. Next the differential signal is amplified utilizing a tank circuit in combination with the transistors, which, for example, in FIG. 1 includes capacitor 132 coupled to a first inductor 120, in combination with the transistors 137a, 137b, via step 230. Finally, a BIMI arrangement is utilized to provide a single ended signal via step 240. In FIG. 1, the BIMI arrangement includes the inductors 110 and 120.

CONCLUSION

Various implementations of the invention overcome the limitations and inefficiencies in the field, one implementation or another: i) comprises a single transference method with inductors galvanically separated from one another for efficiently and effectively converting an incoming differential signal to a single ended signal without creating an intermediary differential signal or direct current signal; ii) consumes less active chip area (i.e., footprint) as a BALUN or integrated-BALUN-chip type of solution may require, without degrading or impacting performance characteristics or operational points of transistors associated therewith: iii) does not require the use of a physically separate BALUN or a BALUN integrated onto or in the chip-side; and iv) performs more efficiently that a traditional approach by having less loss in part due to fewer energy conversion transferences.

Various implementations of the invention further overcomes the limitations of traditional BALUN-based designs, energy losses, and expenses associated with required footprint areas and conversion transferences resulting from conventional approaches and alternative integration of a BALUN to the "on-chip" side.

Various implementations can be utilized for example in various semiconductor devices and/or integrated circuits including but not limited to wireless devices, transmitters, receivers, or transceivers or the like and that use would be within the spirit and scope of the present invention. Furthermore, various implementations could be utilized in electronic systems or the like and that use would be within the spirit and scope of the present invention. In addition to the described processes and implementations of the present invention, the invention may also be used for electronics, circuitry, wafer assembly, high density interconnects, integrated circuitry and other types of devices containing the same or similar applications and uses.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A differential amplifier comprising:
   a transistor pair for receiving a differential signal;
   a tank circuit coupled to the transistor pair, the tank circuit includes a first inductor and one or more capacitors; and
   a second inductor magnetically coupled to the first inductor to form a balanced/unbalanced inductor (BIMI) arrangement, wherein the BIMI arrangement directly converts the differential signal to a single ended signal, and wherein the second inductor is arranged between first and second windings of the first inductor.

2. The differential amplifier of claim 1, wherein the first inductor comprises a balanced inductor and the second inductor comprises an unbalanced inductor.

3. The differential amplifier of claim 1, wherein the first inductor and the second inductor are galvanically separated from one another.

4. The differential amplifier of claim 1, wherein the second indicator is galvanically arranged so as to be non-electrically conductive with the inductor.

5. The differential amplifier of claim 1, wherein the BIMI arrangement converts magnetic energy to a single ended electrical signal.

6. The differential amplifier of claim 5, wherein transference of the single ended signal first traverses a chip side then a package side and finally to a board side before being output as a RE OUT signal.

7. The differential amplifier of claim 1, wherein an RF OUT signal is received by an amplifier connectably arranged with the second inductor.

8. The differential amplifier of claim 7, wherein the amplifier passes an amplified single ended signal to a connected antenna.

9. The differential of claim 1, wherein the amplified single ended signal is provided directly to an antenna.

10. The differential amplifier of claim 8, wherein the amplifier is within a semiconductor device.

11. The differential amplifier of claim 10, wherein the semiconductor device comprises any of a wireless device, transmitter, receiver and transceiver.

12. The differential amplifier of claim 8, wherein the amplifier is within an electronic system.

13. The differential amplifier of claim 1, wherein a DC bias voltage is applied to the first inductor and the first inductor is at AC ground.

14. The differential amplifier of claim 1, wherein the BIMI arrangement provides impedance matching between the differential transistors and the input of an amplifier.

15. A method comprising:
   providing an amplified differential signal, and
   directly converting the amplified differential signal to a single ended signal by providing a balanced/unbalanced inductor (BIMI) arrangement, the BIMI arrangement including a first inductor having windings and a second inductor arranged between the windings of the first inductor.

16. The method of claim 15, wherein providing the amplified differential signal comprises:
   producing a differential signal; and
   amplifying the differential signal to provide the amplified differential signal, wherein the amplified differential signal is provided by a tank circuit that includes the first and second inductors and a capacitor coupled to the first and second inductors.

17. The method of claim 15, wherein directly converting the amplified differential signal comprises:
   converting a magnetic energy from the tank circuit to the single ended electrical signal.

18. The method of claim 15, wherein the single ended signal is received by an amplifier and passed from the amplifier to an antenna coupled to the amplifier.

19. The method of claim 15, wherein the single ended signal is provided to antenna that is coupled to the (BIMI) arrangement.

20. A method comprising:
   receiving a differential signal;
   amplifying the differential signal utilizing a tank circuit to produce an amplified differential signal, wherein the tank circuit includes a first inductor and one or more capacitors; and
   converting the amplified differential signal into a single ended signal by utilizing a balanced/unbalanced inductor (BIMI) arrangement, wherein the BIMI arrangement comprises the first inductor magnetically coupled to a second inductor such that the second inductor is arranged in a space between windings of the first inductor.

21. The method of claim 20, wherein amplifying the differential signal comprises galvanically separating the first inductor and the second inductor from each other.

22. The method of claim 20, wherein converting the amplified differential signal comprises transferring a magnetic energy from the tank circuit to electrical energy by the BIMI arrangement.

23. An apparatus comprising:
   a first transistor and a second transistor forming a transistor pair and configured to receive a differential signal;
   a first inductor including a first end coupled to a terminal of the first transistor, a second end coupled to a terminal of the second transistor, and windings between the first and second ends; and
   a second inductor arranged in a space between the windings of the first inductor, the second inductor including a first end coupled to a ground potential and a second end to provide an output signal based on the differential signal.

24. The apparatus of claim 23, further comprising a capacitor coupled between the terminal of the first transistor and the terminal of the second transistor.

25. The apparatus of claim 24, further comprising an additional capacitor coupled between the ground potential and an additional terminal of the first transistor and an additional terminal of the second transistor.

26. The apparatus of claim 24, wherein the first and second transistors, the first and second inductors, and the capacitor are included in a same integrated circuit chip.

* * * * *

UNITED STATES PATENT AND TRADEMARK OFFICE
CERTIFICATE OF CORRECTION

PATENT NO. : 7,592,872 B2  Page 1 of 1
APPLICATION NO. : 11/870416
DATED : September 22, 2009
INVENTOR(S) : Samir Elias El Rai It is certified that error appears in the above-identified patent and that said Letters Patent is hereby corrected as shown below:

In column 2, line 33, delete "10" and insert -- 110 --, therefor.

In column 3, line 23, delete "10" and insert -- 110 --, therefor.

In column 4, line 26, delete "signal" and insert -- signal, --, therefor.

In column 4, line 48, delete "therewith:" and insert -- therewith; --, therefor.

In column 5, line 39, in Claim 6, delete "RE" and insert -- RF --, therefor.

Signed and Sealed this

Sixteenth Day of February, 2010

David J. Kappos
*Director of the United States Patent and Trademark Office*